United States Patent
Yu et al.

(10) Patent No.: US 7,639,059 B1
(45) Date of Patent: Dec. 29, 2009

(54) FAST SETTLING REFERENCE VOLTAGE BUFFER WITH WIDE REFERENCE RANGE

(75) Inventors: Hao Yu, Fremont, CA (US); Sing Chin, Alameda, CA (US); Bill Wong, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 292 days.

(21) Appl. No.: 11/853,827

(22) Filed: Sep. 12, 2007

(51) Int. Cl.
*H03L 5/00* (2006.01)

(52) U.S. Cl. .................. 327/333; 327/108; 326/81; 365/226

(58) Field of Classification Search ............... 327/77, 327/108, 208, 333, 334, 534, 433, 543; 326/17, 326/33, 71, 81, 83, 68; 365/189.05, 189.09, 365/185.23, 226; 323/312–316, 282
See application file for complete search history.

(56) References Cited

U.S. PATENT DOCUMENTS

| | | | | |
|---|---|---|---|---|
| 5,587,676 A | * | 12/1996 | Chowdhury | ............... 327/108 |
| 5,872,476 A | * | 2/1999 | Mihara et al. | ............... 327/333 |
| 6,002,290 A | * | 12/1999 | Avery et al. | ................. 327/333 |
| 6,384,631 B1 | * | 5/2002 | Wert et al. | .................... 326/68 |

* cited by examiner

*Primary Examiner*—Rajnikant B Patel
(74) *Attorney, Agent, or Firm*—Patent Law Group LLP; Carmen C. Cook

(57) ABSTRACT

A reference voltage buffer circuit (20) includes first and second transistors (M1, M2) and first and second resistors (R1, R2) connected in series between positive and negative power supply voltages and providing a positive reference voltage (Vrp) and a negative reference voltage (Vrn) at the first current handling terminals of the first and second transistors, respectively. A first control voltage (Vg1) for driving the first transistor is generated by a first feedback loop and using a positive boosted voltage. A second control voltage (Vg2) for driving the second transistor is generated by a second feedback loop and using a negative boosted voltage. The first and second feedback loops establish the first and second control voltages while the positive and negative boosted voltages ensure sufficient drives are provided to the first and second transistors. The reference voltage buffer is capable of fast settling while maintaining a wide reference voltage range.

8 Claims, 2 Drawing Sheets

FAST SETTLING REFERENCE VOLTAGE BUFFER WITH WIDE REFERENCE RANGE

FIELD OF THE INVENTION

The invention relates to reference voltage buffers and, in particular, to a reference voltage buffer with short settling time and wide reference voltage range.

DESCRIPTION OF THE RELATED ART

With the development of modern electronics, higher speed, higher accuracy with lower power consumption are highly desired features for data conversion system. For instance, more and more channels of ADCs are required in portable ultrasound systems to capture medical pictures. The increased numbers of ADC channels put higher and higher demands in channel power budget, resolution and speed.

Reference voltage buffers are critical building blocks in data conversion system to achieve high resolution while keeping the power consumption low. A differential reference voltage buffer is designed for applications requiring high speed, high accuracy settling. In order to ensure a wide voltage swing range under low power supply voltage, a buffer with a wide reference voltage range is preferred.

Under the drive of Moore's law, integrated circuit feature size and supply voltage decrease continuously and will follow this trend in the years coming. The lower supply voltage imposes many difficulties on the design of accurate analog circuitry. High dynamic range requires higher signal swing range and low device noise. However, lower supply voltage limit the internal signal swing, which demands bigger capacitor size for lower noise in order to maintain the dynamic range. While bigger size capacitors demand higher power consumption, which runs in the opposite direction of lower power consumption.

In order to overcome the drawback of the lower supply voltage, the reference voltage range for a reference voltage buffer needs to be kept as wide as possible. For example, the standard supply voltage is 1.8V in a 0.18 μm process with a 1.0V reference voltage range desirable for low power consumption design. In such a reference voltage buffer, the positive reference voltage (Vrp) is 1.3V and the negative reference voltage (Vrn) is 0.3V. But there are many design challenges for achieving these design criteria.

FIG. 1 is a circuit diagram of a conventional power efficient reference voltage buffer. Referring to FIG. 1, the reference voltage buffer 10 includes a NMOS transistor M1, resistors R1, R2 and a PMOS transistor M2 connected in series between the positive power supply voltage Vdd and the negative power supply voltage or ground voltage Vss. Transistor M1 is driven by a gate voltage Vg1 to generate the positive reference voltage Vrp at the source terminal (node 15) of transistor M1. Transistor M2 is driven by a gate voltage Vg2 to generate the negative reference voltage Vrn at the source terminal (node 17) of transistor M2. The gate voltages Vg1 and Vg2 of transistors M1 and M2 are set by other circuitry (not shown) to set the desired voltage values for voltages Vrp and Vrn. For example, for a power supply voltage Vdd of 1.8V, Vrp is set to 1.3V and Vrn is set to 0.3V.

In reference voltage buffer 10, transistors M1 and M2 share the same current to generate voltages Vrp and Vrn for high power efficiency. The quiescent output impedance of Vrp and Vrn is 1/gm1 and 1/gm2, respectively. The resistors R1 and R2 are adjusted to establish a current Id1 is given as: (Vrp−Vrn)/(R1+R2). The current source topology of reference voltage buffer 10 is very effective in the dynamic charging of sampling capacitors in analog-to-digital converters (ADCs). In operation, the transient voltage at node Vrp will go down when the reference voltage buffer is connected to the sampling capacitors. At this time, the current going through transistor M1 will increase significantly, so that the equivalent output impedance drops to help bring Vrp up. The mechanism for negative reference voltage Vrn is the same as for voltage Vrp, except their swing direction is opposite.

One design challenge for reference voltage buffer 10 is setting up voltages Vg1 and Vg2 for driving transistors M1 and M2. To achieve the desired reference voltages of 1.3V and 0.3V, voltage Vg1 needs to be larger than 1.6V and voltage Vg2 needs to be lower than 0V, assuming that a gate-to-source voltage Vgs of |Vgs|>0.3V is needed to allow enough current to flow through transistors M1 and M2. However, with the consideration of lower power supply voltage and the necessary voltage overhead, the aforementioned voltage values for voltages Vg1 and Vg2 cannot be set by using normal power supply Vdd and Vss voltages. When the voltage values for voltages Vg1 and Vg2 are limited, the voltage range of the reference voltages Vrp and Vrn becomes limited. Accordingly, as the power supply voltage Vdd decreases, the reference voltage range is compressed.

When the reference voltages Vrp and Vrn from reference voltage buffer 10 are used in an ADC to charge the sampling capacitors, settling time refers to how fast the sampling capacitors can be charged to the respective reference voltage. The reference voltages Vrp and Vrn from reference voltage buffer 10 are used in an ADC to charge the sampling capacitors. The voltage range of the reference voltages in the conventional reference voltage buffer is reduced to obtain the desired fast settling.

For the above reasons, it is difficult to achieve the competing requirements of fast settling time and wide reference voltage range in the conventional reference voltage buffer.

DETAILED DESCRIPTION OF THE PREFERRED EMBODIMENTS

In accordance with the principles of the present invention, a reference voltage buffer uses boosted power supply voltages and a pair of voltage feedback loops for setting the gate voltages for driving a pair NMOS and PMOS transistors to generate a pair of positive and negative reference voltages. In this manner, the gate drive voltages for the NMOS and PMOS transistors generating the positive and negative reference voltages are decoupled from the reference voltage values themselves, since the boosted power supply voltages set the gate drive voltages of the NMOS/PMOS transistors beyond the normal power supply voltage range. Thus, the reference voltage buffer can maintain a wide reference voltage range while also achieve fast settling and improved power efficiency.

Figure 1:
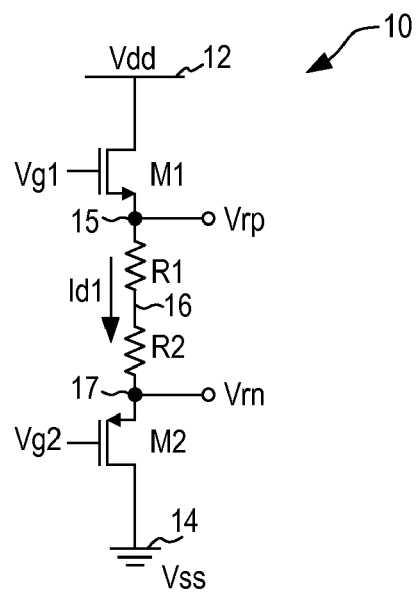
FIG. 1 is a circuit diagram of a conventional power efficient reference voltage buffer.
Figure 2:
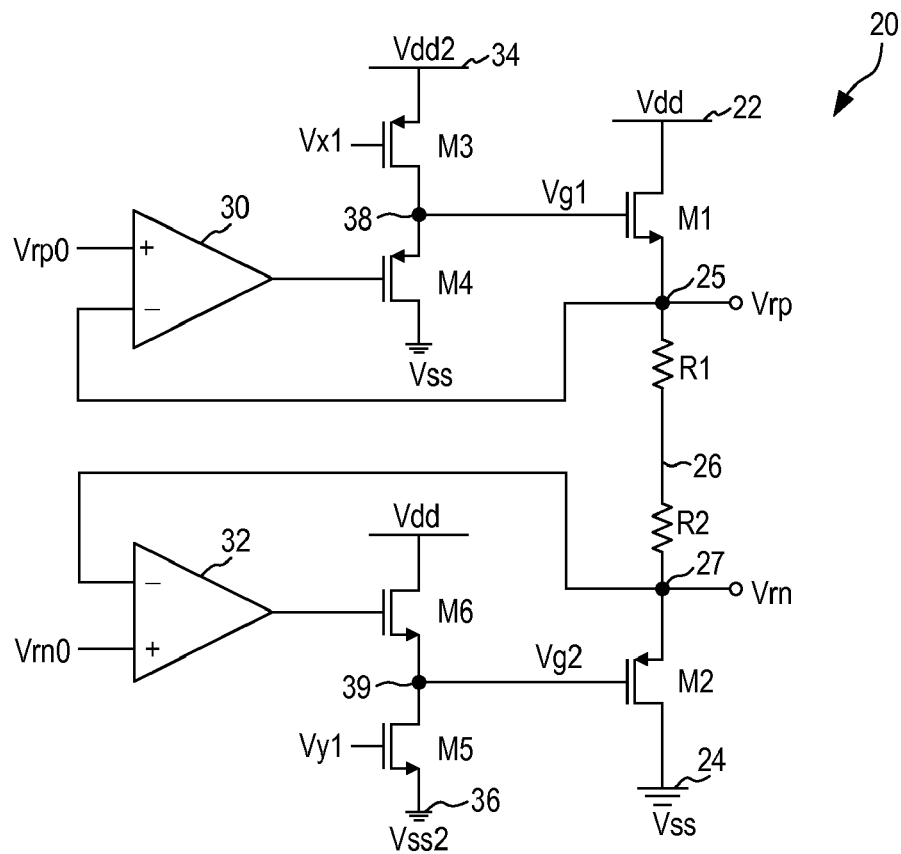
FIG. 2 is a circuit diagram of a reference voltage buffer circuit according to one embodiment of the present invention.

FIG. 2 is a circuit diagram of a reference voltage buffer circuit according to one embodiment of the present invention. Referring to FIG. 2, a reference voltage buffer 20 is formed using the basic current source topology shown in FIG. 1. Therefore, reference voltage buffer 20 includes an NMOS transistor M1, resistors R1, R2 and a PMOS transistor M2 connected in series between the positive power supply voltage Vdd (node 22) and the negative power supply voltage or ground voltage Vss (node 24). Transistor M1 is driven by a gate voltage Vg1 to generate the positive reference voltage Vrp at the source terminal (node 25) of transistor M1. Transistor M2 is driven by a gate voltage Vg2 to generate the negative reference voltage Vrn at the source terminal (node 27) of transistor M2.

In accordance with the present invention, the gate voltages Vg1 and Vg2 of transistors M1 and M2 are set by respective feedback loops so that the reference voltages are set to the desired values. Positive and negative boosted voltages are generated to supply the minimum required currents to set up the desired voltage values for voltages Vg1 and Vg2. Gate voltages Vg1 and Vg2 are decoupled from the voltage values of the positive and negative reference voltages Vrp and Vrn. In this manner, fast settling is enabled while maintaining a wide reference voltage range.

With respective to gate voltage Vg1, a positive boosted voltage Vdd2, being greater than the positive power supply voltage Vdd, is generated. A pair of PMOS transistors M3 and M4 are connected in series between the positive boosted voltage Vdd2 (node 34) and the negative power supply voltage or ground voltage Vss. The common node (node 38) between transistors M3 and M4 is the gate voltage Vg1. The gate terminal of transistor M4 is driven by an error amplifier 30. Error amplifier 30 has a non-inverting input terminal coupled to receive a reference voltage Vrp0 and an inverting input terminal connected to the positive reference voltage Vrp (node 25) to form a feedback loop. The feedback loop of error amplifier 30 operates to keep the reference voltage Vrp to be the same as voltage Vrp0. Voltage Vrp0 is selected to be the desired positive reference voltage value. In operation, error amplifier 30 generates the gate voltage for driving transistor M4 so that the error between the inverting and non-inverting input terminals of the amplifier is zero. The drain terminal (node 38) of transistor M4 is the gate voltage Vg1 for driving the gate terminal of transistor M1. Transistor M3 is connected to the boosted voltage Vdd2 to ensure that sufficient current is supplied to transistor M4 to generate the desired gate voltage Vg1 under all positive power supply voltage Vdd values.

The gate voltage Vg2 is generated in a similar manner to the gate voltage Vg1. In the case of gate voltage Vg2, a negative boosted voltage Vss2, being less than the negative power supply voltage or the ground voltage Vss, is generated. A pair of NMOS transistors M5 and M6 are connected in series between the positive power supply voltage Vdd (node 22) and the boosted negative boosted voltage Vss2 (node 36). The common node (node 39) between transistors M5 and M6 is the gate voltage Vg2. The gate terminal of transistor M6 is driven by an error amplifier 32. Error amplifier 32 has a non-inverting input terminal coupled to receive a reference voltage Vrn0 and an inverting input terminal connected to the positive reference voltage Vrn (node 27) to form a feedback loop. The feedback loop of error amplifier 32 operates to keep the reference voltage Vrn to be the same as voltage Vrn0. Voltage Vrn0 is selected to be the desired negative reference voltage value. In operation, error amplifier 32 generates the gate voltage for driving transistor M6 so that the error between the inverting and non-inverting input terminals of the amplifier is zero. The drain terminal (node 39) of transistor M6 is the gate voltage Vg2 for driving the gate terminal of transistor M2. Transistor M5 is connected to the boosted voltage Vss2 to ensure that sufficient current is supplied to transistor M5 to generate the desired gate voltage Vg2 under all power supply voltage Vdd values.

In one embodiment, error amplifiers 30, 32 are implemented using operational amplifiers.

Transistors M3 and M5 function as current sources to supply currents to the gate terminals of transistors M1 and M2, respectively, so as to maintain the desired gate voltages Vg1 and Vg2. In one embodiment, the currents in transistors M3 and M5 are set by current mirrors that are powered by the power supply Vdd voltage. The amount of current supplied by transistors M3 and M5 should be high enough so that the noise from transistors M3, M4, M5, and M6 will not deteriorate the noise performance of the reference voltage buffer. However, the current needed to bias transistor M3 or M5 is small compared to the main current required to set the biasing point for transistors M1 and M2. Accordingly, the effort to generate boosted voltages does not affect the overall power consumption performance of the reference voltage buffer. In one embodiment, the gate terminals of transistors M3 and M5 are driven by voltages generated from biasing circuits.

Figure 3:
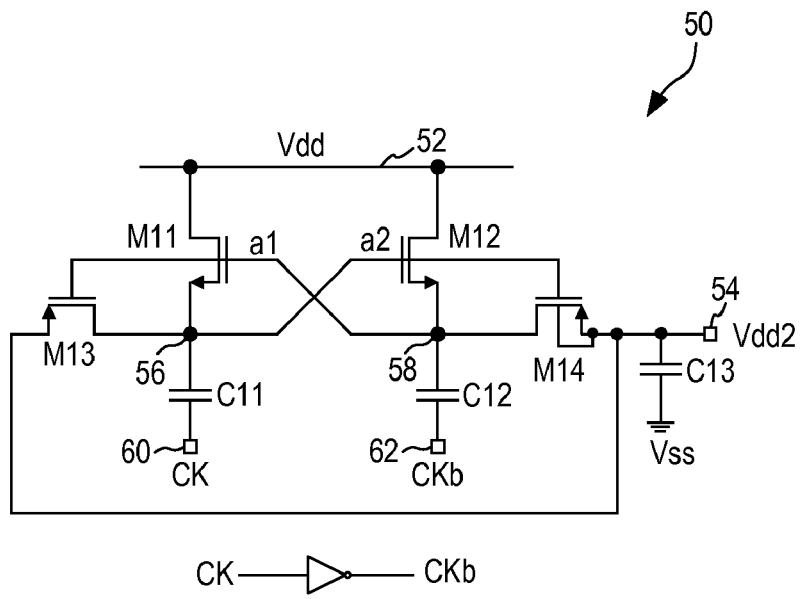
FIG. 3 is a circuit diagram of a boost circuit for generating the positive boosted voltage Vdd2 according to one embodiment of the present invention.

FIG. 3 is a circuit diagram of a boost circuit for generating the positive boosted voltage Vdd2 according to one embodiment of the present invention. Referring to FIG. 3, the boost circuit 50 is basically a charge pump operating on a clock signal CK and its inverse CKb to generate the boosted voltage Vdd2 at the output node 54. The operation of the boost circuit 50 is as follows. After the boost circuit 50 reaches stable operation, when clock CK is high and clock CKb is low, then voltage a2 at node 56 and the gate terminal of transistor M12 is equal to VDD+Vc11 and the voltage a1 at node 58 and the gate terminal of transistor M11 is equal to VSS+Vc12, where Vc11, Vc12 are approximately equal to voltages between the power supply voltages Vdd and Vss. At this time, transistor M14 is cut off but transistor M13 is turn on. The charges stored at capacitor C11 distribute to capacitor C13 to set up boosted voltage Vdd2 through transistor M13. At the same time, voltage a2 turns on transistor M12 so that the power supply voltage VDD replenishes the charge at capacitor C12 (voltage a1). In the next clock phase, i.e. clock CK=low and clock CKb=high, capacitor C12 will distribute its stored charges to capacitor C13 (node 54). In this manner, the boosted voltage Vdd2 is generated at output node 54.

Figure 4:
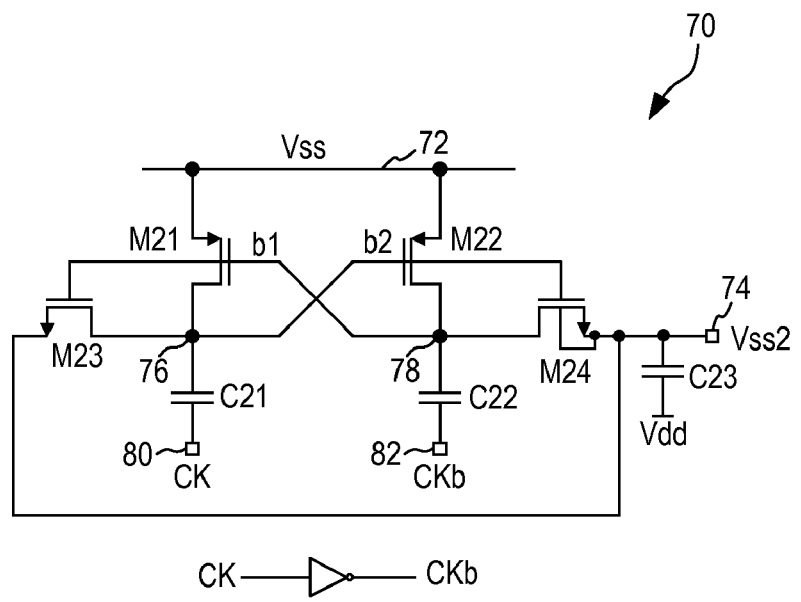
FIG. 4 is a circuit diagram of a boost circuit for generating the negative boosted voltage Vss2 according to one embodiment of the present invention.

FIG. 4 is a circuit diagram of a boost circuit for generating the negative boosted voltage Vss2 according to one embodiment of the present invention. Referring to FIG. 4, the boost circuit 70 to generate the negative boosted voltage Vss2 is constructed in the same manner as boost circuit 50 in FIG. 3. Transistors M23 and M24 are alternately turned on to charge capacitor C23 and output node 74 to the boosted voltage Vss2.

In the boost circuits of FIGS. 3 and 4, body biasing circuits may be included to prevent latch-up during circuit power-up.

The reference voltage buffer of the present invention achieves many advantages not realized in conventional buffer circuits. For example, the reference voltage buffer of the present invention has been applied in a 14-bit ADC. The reference voltage buffer achieves fast settling while maintaining a wide reference voltage range. Compared with external capacitive decoupling solution, the reference voltage circuit of the present invention improves harmonic distortion as well as saves pins and printed board area.

In the above descriptions, the reference voltage buffer and the boost circuits are shown to be implemented using MOS transistors. In other embodiments, the reference voltage buffer of the present invention, including the boost circuits, can be implemented using bipolar transistors, as is well understood by one of ordinary skill in the art.

The above detailed descriptions are provided to illustrate specific embodiments of the present invention and are not intended to be limiting. Numerous modifications and variations within the scope of the present invention are possible. The present invention is defined by the appended claims.

We claim:

1. A reference voltage buffer circuit (20) comprising:
   a first transistor (M1) of a first type having a first current handling terminal coupled to a first output node (25) providing a positive reference voltage (Vrp), a second current handling terminal (22) coupled to a positive power supply voltage (Vdd), and a control terminal receiving a first control voltage (Vg1);
   a second transistor (M2) of a second type having a first current handling terminal (24) coupled to a second output node (27) providing a negative reference voltage (Vrn), a second current handling terminal coupled to a negative power supply voltage (Vss), and a control terminal receiving a second control voltage (Vg2);
   first and second resistors (R1, R2) connected in series between the first output node and the second output node;
   a first boost circuit for generating a positive boosted voltage (Vdd2) greater than the positive power supply voltage;
   a second boost circuit for generating a negative boosted voltage (Vss2) less than the negative power supply voltage;
   third and fourth transistors (M3, M4) of the second type connected in series between the positive boosted voltage and the negative power supply voltage, a common node (38) between the third and fourth transistors being coupled to the control terminal of the first transistor;
   a first error amplifier having a non-inverting input terminal coupled to receive a first reference voltage (Vrp0), an inverting input terminal coupled to the first output node and an output terminal coupled to drive the control terminal of the fourth transistor, the first error amplifier generating a control voltage for the fourth transistor indicative of the difference between the positive reference voltage and the first reference voltage;
   fifth and sixth transistors (M5, M6) of the first type connected in series between the positive power supply voltage and the negative boosted voltage, a common node (39) between the fifth and sixth transistors being coupled to the control terminal of the second transistor; and
   a second error amplifier having a non-inverting input terminal coupled to receive a second reference voltage (Vrn0), an inverting input terminal coupled to the second output node and an output terminal coupled to drive the control terminal of the sixth transistor, the second error amplifier generating a control voltage for the sixth transistor indicative of the difference between the negative reference voltage and the second reference voltage,
   wherein the fourth and sixth transistors generate the first and second control voltages respectively for the first and second transistors and the third transistor and the fifth transistors are biased to supply current to the first current handling terminals of the fourth and sixth transistors, respectively, to maintain the first and second control voltages.

2. The reference voltage buffer circuit of claim 1, wherein transistors of the first type comprise NMOS transistors and transistors of the second type comprise PMOS transistors, the first current handling terminals comprising source terminals, the second current handling terminal comprising drain terminals and the control terminal comprising gate terminals.

3. The reference voltage buffer circuit of claim 1, wherein transistors of the first type comprise NPN bipolar transistors and transistors of the second type comprise PNP bipolar transistors, the first current handling terminals comprising emitter terminals, the second current handling terminal comprising collectors terminals and the control terminal comprising base terminals.

4. The reference voltage buffer circuit of claim 1, wherein the first reference voltage is selected to equal to the desired voltage value for the positive reference voltage and the second reference voltage is selected to equal to the desired voltage value for the negative reference voltage.

5. The reference voltage buffer circuit of claim 1, wherein the control terminals of the third and the fifth transistors are biased by respective biasing circuits to generate current for supplying the first current handling terminals of the fourth and the sixth transistors.

6. The reference voltage buffer circuit of claim 1, wherein the first boost circuit (50) comprises:
   a seventh transistor (M11) of the first type having a first current handling terminal coupled to a first node (56), a second current handling terminal (52) coupled to the positive power supply voltage, and a control terminal coupled to a second node (58);
   a first capacitor (C11) coupled between the first node (56) and a first clock signal;
   an eighth transistor (M12) of the first type having a first current handling terminal coupled to the second node (58), a second current handling terminal (52) coupled to the positive power supply voltage, and a control terminal coupled to the first node (56);
   a second capacitor (C12) coupled between the second node (58) and an inverse of the first clock signal;
   a ninth transistor (M13) of the second type having a first current handling terminal coupled to an output node (54), a second current handling terminal coupled to the first node (56), and a control terminal coupled to the second node (58);
   a tenth transistor (M14) of the second type having a first current handling terminal coupled to the output node (54), a second current handling terminal coupled to the second node (58), and a control terminal coupled to the first node (56); and
   a third capacitor (C13) coupled between the output node (54) and the negative power supply voltage, the positive boosted voltage (Vdd2) being provided at the output node (54).

7. The reference voltage buffer circuit of claim 1, wherein the second boost circuit (70) comprises:
   an eleventh transistor (M21) of the second type having a first current handling terminal (72) coupled to the negative power supply voltage, a second current handling terminal coupled to a third node (76), and a control terminal coupled to a fourth node (78);
   a fourth capacitor (C21) coupled between the third node (76) and a first clock signal;
   a twelfth transistor (M22) of the second type having a first current handling terminal (72) coupled to the negative power supply voltage, a second current handling terminal coupled to the fourth node (78), and a control terminal coupled to the third node (76);
   a fifth capacitor (C22) coupled between the fourth node (78) and an inverse of the first clock signal;

a thirteenth transistor (M23) of the first type having a first current handling terminal coupled to an output node (74), a second current handling terminal coupled to the third node (76), and a control terminal coupled to the fourth node (78);

a fourteenth transistor (M24) of the first type having a first current handling terminal coupled to the output node (74), a second current handling terminal coupled to the fourth node (78), and a control terminal coupled to the third node (76); and a sixth capacitor (C23) coupled between the output node (74) and the positive power supply voltage, the negative boosted voltage (Vss2) being provided at the output node (74).

8. The reference voltage buffer circuit of claim 1, wherein the first and second error amplifiers each comprises an operational amplifier.

\* \* \* \* \*